(12) United States Patent
Aoki et al.

(10) Patent No.: US 9,263,639 B2
(45) Date of Patent: Feb. 16, 2016

(54) GROUP III NITRIDE SEMICONDUCTOR LIGHT-EMITTING DEVICE

(71) Applicant: TOYODA GOSEI CO., LTD., Kiyosu-shi (JP)

(72) Inventors: Masato Aoki, Kiyosu (JP); Yoshiki Saito, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 5 days.

(21) Appl. No.: 14/329,809

(22) Filed: Jul. 11, 2014

(65) Prior Publication Data
US 2015/0030046 A1    Jan. 29, 2015

(30) Foreign Application Priority Data

Jul. 25, 2013 (JP) ................................. 2013-154120

(51) Int. Cl.
| | |
|---|---|
| *H01L 31/06* | (2012.01) |
| *H01L 21/28* | (2006.01) |
| *H01L 33/30* | (2010.01) |
| *H01L 33/02* | (2010.01) |
| *H01L 33/32* | (2010.01) |
| *H01L 33/00* | (2010.01) |

(52) U.S. Cl.
CPC .............. *H01L 33/305* (2013.01); *H01L 33/025* (2013.01); *H01L 33/325* (2013.01); *H01L 33/0075* (2013.01)

(58) Field of Classification Search
CPC .................................................... H01L 33/305
USPC .......... 257/201, 615, 745, E21.118, E21.542, 257/E21.697; 438/604, 933
See application file for complete search history.

(56) References Cited

U.S. PATENT DOCUMENTS

| | | | | |
|---|---|---|---|---|
| 6,829,273 | B2 * | 12/2004 | Amano | .................. B82Y 20/00 372/42 |
| 8,859,313 | B2 | 10/2014 | Sakai | |
| 2011/0155046 | A1 | 6/2011 | Yamazaki | |

FOREIGN PATENT DOCUMENTS

| | | |
|---|---|---|
| JP | 10-004210 A | 1/1998 |
| JP | H10-242587 A | 9/1998 |
| JP | 2001-044497 A | 2/2001 |
| JP | 2001-196702 A | 7/2001 |

(Continued)

OTHER PUBLICATIONS

Japanese Office Action dated Dec. 8, 2015 with a partial English translation thereof.

*Primary Examiner* — Calvin Lee
(74) *Attorney, Agent, or Firm* — McGinn IP Law Group, PLLC

(57) ABSTRACT

The present invention provides a Group III nitride semiconductor light-emitting device exhibiting improved emission output. The light-emitting device comprises an n-type contact layer on which an n-electrode is formed, a light-emitting layer, an n-type cladding layer formed between the light-emitting layer and the n-type contact layer. The n-type cladding layer has a structure of at least two layers including a first n-type cladding layer closer to the light-emitting layer and a second n-type cladding layer farther from the light-emitting layer than the first n-type cladding layer. The first n-type cladding layer has a Si concentration higher than that of the second n-type cladding layer, and the first n-type cladding layer has a thickness smaller than that of the second n-type cladding layer.

19 Claims, 6 Drawing Sheets

(56) References Cited

FOREIGN PATENT DOCUMENTS

| JP | 2002-299762 A | 10/2002 |
| JP | 3909694 B2 | 4/2007 |
| JP | 2011-077499 A | 4/2011 |
| JP | 2011-187572 A | 9/2011 |

* cited by examiner 0.74 Si concentration 0

GROUP III NITRIDE SEMICONDUCTOR LIGHT-EMITTING DEVICE

BACKGROUND OF THE INVENTION

1. Field of the Invention

The present invention relates to a Group III nitride semiconductor light-emitting device exhibiting improved emission output.

2. Background Art

Conventionally, the following Group III nitride semiconductor light-emitting devices have been known. Japanese Patent Application Laid-Open (kokai) No. 2002-299762 discloses a laser in which an n-type cladding layer and a p-type cladding layer, each layer having a two-layer structure, are disposed respectively at the top and bottom of the core comprising an active layer and guide layers enclosing the active layer. In this laser, free carrier absorption loss is reduced by lowering the impurity concentrations of the n-type cladding layer and the p-type cladding layer closer to the active layer respectively than those of the n-type cladding layer and the p-type cladding layer farther from the active layer, to thereby reduce the threshold voltage. Each n-type cladding layer of the two-layer structure is a superlattice layer.

Japanese Patent No. 3909694 discloses a Group III nitride semiconductor light-emitting device comprising an n-type contact layer formed of n-type GaN, an n-type cladding layer formed of n-type AlGaInN, and an active layer, wherein a crack prevention layer formed of n-type GaN is provided between the n-type cladding layer and the n-type contact layer. The impurity concentration of the crack prevention layer is smaller than that of the n-type contact layer. By virtue of crack prevention layer formed of GaN, the increase of waveguide loss is suppressed.

Japanese Patent Application Laid-Open (kokai) No. 1998-4210 discloses a light-emitting device wherein a buffer layer, an n-type layer (first low-impurity concentration layer) formed of Si-doped GaN (thickness: 0.6 μm, Si concentration: $2\times10^{18}/cm^3$, and electron concentration: $1\times10^{18}/cm^3$), a high-carrier concentration n$^+$-type layer (high-impurity concentration layer) formed of Si-doped GaN (thickness: 4.0 μm, Si concentration: $4\times10^{18}/cm^3$, and electron concentration: $2\times10^{18}/cm^3$), an n-type layer (second low-impurity concentration layer) formed of Si-doped GaN (thickness: 0.5 μm, Si concentration: $1\times10^{18}/cm^3$, and electron concentration: $5\times10^{17}/cm^3$), and a light-emitting layer are disposed in this order.

Japanese Patent Application Laid-Open (kokai) No. 2001-196702 discloses a laser diode wherein an n-type contact layer, an n-type cladding layer formed of Si-doped Al$_{0.08}$Ga$_{0.92}$N (thickness: 1 μm, and electron concentration: $5\times10^{17}/cm^3$), an n-type guide layer formed of Si-doped GaN (thickness: 100 nm, and electron concentration: $5\times10^{17}/cm^3$) and an active layer are provided in this order on.

Japanese Patent Application Laid-Open (kokai) No. 2001-44497 discloses a light-emitting device wherein a buffer layer, a contact layer formed of Si-doped AlGaN (thickness: 3 μm, and Si concentration: $1\times10^{18}/cm^3$), a cladding layer formed of Si-doped AlGaN (thickness: 1 μm, and Si concentration: $1\times10^{18}/cm^3$), an optical waveguide layer formed of Si-dope GaN (thickness: 0.1 μm, and Si concentration: $1\times10^{18}/cm^3$), and a light-emitting layer are disposed in this order.

The above patent documents disclose a light-emitting device in which a Group III nitride semiconductor was hetero-epitaxially grown on a heterogeneous substrate such as sapphire through MOCVD. In such light-emitting device, the n-type layer to bond with the light-emitting layer, has a low Si concentration of $5\times10^{18}/cm^3$ or less (including no impurity added) so as not to deteriorate the crystallinity of the light-emitting layer.

However, the present inventors have found that in the light-emitting device in which a Group III nitride semiconductor was homo-epitaxially grown on a Group III nitride semiconductor growth substrate, the emission output does not increase compared to the light-emitting device employing a sapphire substrate when the n-type layer to bond with the light-emitting layer has a low Si concentration of $5\times10^{18}/cm^3$ or less.

The present inventors assumed the reason of this as follows. When a Group III nitride semiconductor is hetero-epitaxially grown on a heterogenous substrate such as sapphire through MOCVD, high-density pits are enlarged in diameter from lower layer to the upper layer along with growth as shown in FIG. 7, due to a large lattice mismatch between the substrate and the growing Group III nitride semiconductor. The pit diameter was large, 150 nm to 200 nm and the pit density was large, $1\times10^{8}/cm^2$ to $1\times10^{9}/cm^2$ on the top surface of the light-emitting layer. Since the pits are filled with a p-type layer semiconductor, the distance is equivalently shortened between the n-type layer and the p-type layer to which a voltage is applied. Therefore, electrons and holes are easily recombined in the light-emitting layer even if the n-type layer to bond with the light-emitting layer has a low Si concentration of $5\times10^{18}/cm^3$ or less and a low conductivity. As a result, a higher emission output is obtained.

On the contrary, when a Group III nitride semiconductor is homo-epitaxially grown on a Group III nitride semiconductor growth substrate, the crystallinity of the epitaxial grown layer is improved, the pit density is low and the pit diameter is small in the light-emitting layer. When the n-type layer to bond with the light-emitting layer has a low Si concentration of $5\times10^{18}/cm^3$ similarly as in the light-emitting device employing a sapphire substrate, the effect of the p-type layer to fill in the above pits is reduced, the equivalent distance is lengthened between the p-type layer and the n-type layer to which a voltage is applied. Therefore, the present inventors thought that the probability of recombination of electrons and holes in the light-emitting layer is reduced, and a higher emission output cannot be obtained compared to the light-emitting device employing a sapphire substrate.

SUMMARY OF THE INVENTION

In view of the foregoing, an object of the present invention is to suppress the reduction of emission output in a light-emitting device produced by epitaxially growing Group III nitride semiconductor on a Group III nitride semiconductor growth substrate.

Other object of the present invention is to suppress the reduction of emission output in a light-emitting device having a low pit density or a small pit diameter even if a growth substrate is formed of a material other than Group III nitride semiconductor.

In a first aspect of the present invention, there is provided a Group III nitride semiconductor light-emitting device having a plurality of Group III nitride semiconductor layers on a surface of a Group III nitride semiconductor substrate, the light-emitting device comprising:

an n-type contact layer on which an n-electrode is formed, a light-emitting layer, an n-type cladding layer formed between the light-emitting layer and the n-type contact layer;

wherein the n-type cladding layer has a structure of at least two layers including a first n-type cladding layer closer to the light-emitting layer and a second n-type cladding layer farther from the light-emitting layer than the first n-type cladding layer; and the Si concentration of the first n-type cladding layer is higher than that of the second n-type cladding layer, and the thickness of the first n-type cladding layer is smaller than that of the second n-type cladding layer.

The light-emitting device of the present invention may have a plurality of layers serving other functions as long as it comprises at least a Group III nitride semiconductor substrate, an n-type contact layer, an n-type cladding layer, a light-emitting layer, a p-type cladding layer, and a p-type contact layer. Preferably, the light-emitting layer is directly bonded to the first n-type cladding layer. However, a guide layer may be provided between the light-emitting layer and the first n-type cladding layer. The light-emitting layer may be a single layer, or may have a SQW structure including one well layer and barrier layers at both sides thereof or a MQW structure in which a plurality of layer units repeatedly deposited, each layer unit comprising a well layer and a barrier layer. The substrate may be formed of Group III nitride semiconductor having any composition ratio such as GaN, AlGaN, InGaN, and AlGaInN. The semiconductor layers to be grown on a substrate, e.g., an n-type contact layer, an n-type cladding layer, a light-emitting layer, a p-type cladding layer, and a p-type contact layer, may be formed of a 4-component semiconductor such as AlGaInN, a 3-component semiconductor such as AlGaN or InGaN, or a 2-component semiconductor such as GaN, each semiconductor having any composition ratio. In such semiconductors, Al, Ga, or In may be partially substituted by another Group 13 element (Group 3B element) (i.e., B or Tl), or N may be partially substituted by another Group 15 element (Group 5B element) (i.e., P, As, Sb, or Bi).

In the present invention, the first n-type cladding layer preferably has a Si concentration of $1.0 \times 10^{19}/cm^3$ to $2.5 \times 10^{19}/cm^3$. The first n-type cladding layer preferably has a thickness of 5 nm to 50 nm. The pit density is preferably $5.0 \times 10^6/cm^2$ or less on a top surface opposite to the n-type cladding layer of the light-emitting layer. The smaller the lower limit of the pit density, the more preferable. The lower limit is the value when the occurrence of pits is not avoidable in homo-epitaxial growth. The pit diameter is preferably 100 nm or less on a top surface opposite to the n-type cladding layer of the light-emitting layer. The smaller the pit diameter, the more preferable. The lower limit is the value when the occurrence of pits is not avoidable in homo-epitaxial growth. The second n-type cladding layer preferably has a Si concentration of $1.0 \times 10^{18}/cm^3$ to $5.0 \times 10^{18}/cm^3$, which is equivalent to the Si concentration of the conventional n-type cladding layer. Within this range, the emission output of the light-emitting device using a Group III nitride semiconductor substrate is higher than that of the light-emitting device using a sapphire substrate. The second n-type cladding layer preferably has a thickness of 100 nm to 500 nm.

In a second aspect of the present invention, there is provided a Group III nitride semiconductor light-emitting device having a plurality of Group III nitride semiconductor layers on a surface of a substrate made of a material different from Group III nitride semiconductor, the light-emitting device comprising:

an n-type contact layer on which an n-electrode is formed, a light-emitting layer, an n-type cladding layer formed between the light-emitting layer and the n-type contact layer;

wherein the pit density is $5.0 \times 10^6/cm^2$ or less, and the pit diameter is 100 nm or less on a top surface opposite to the n-type cladding layer of the light-emitting layer;

the n-type cladding layer has a structure of at least two layers including a first n-type cladding closer to the light-emitting layer and a second n-type cladding layer farther from the light-emitting layer than the first n-type cladding layer; and the Si concentration of the first n-type cladding layer is higher than that of the second n-type cladding layer, and the thickness of the first n-type cladding layer is smaller than that of the second n-type cladding layer.

In the first aspect of the invention, it was measured that the pit density was $5.0 \times 10^6/cm^2$ or less and the pit diameter was 100 nm or less on the top surface opposite to the n-type cladding layer of the light-emitting layer. The inventors of the present invention considered that the reduction of the emission output is caused by the reduction of the pit density and the pit diameter. Therefore, even in a light-emitting device employing a substrate made of a material different from Group III nitride semiconductor, when the pit density and the pit diameter fall below the above values by lateral growth, surfactant growth, MBE, other growth methods, or progress of MOCVD, light-emitting layer, the characterizing structure of the present invention may be used.

In other words, the structure in which the Si concentration of the first n-type cladding layer is higher than that of the second n-type cladding layer, and the thickness of the first n-type cladding layer is smaller than that of the second n-type cladding layer as a characterizing part of the first aspect of the present invention, may be employed when the pit density is $5.0 \times 10^6/cm^2$ or less, and the pit diameter is 100 nm or less on the top surface of the light-emitting layer. Therefore, the second aspect of the present invention is established. The substrate of the second aspect of the present invention may be formed of sapphire, SiC, silicon, or ZnO.

In the second aspect of the present invention, the first n-type cladding layer preferably has a Si concentration of $1.0 \times 10^{19}/cm^3$ to $2.5 \times 10^{19}/cm^3$. The first n-type cladding layer preferably has a thickness of 5 nm to 50 nm. The second n-type cladding layer preferably has a Si concentration of $1.0 \times 10^{18}/cm^3$ to $5.0 \times 10^{18}/cm^3$. The second n-type cladding layer preferably has a thickness of 100 nm to 500 nm. The significance of the value range is the same as in the first aspect of the present invention, and other structures are also established as described in the first aspect of the present invention.

In the present invention, the n-type cladding layer has a structure of at least two layers including a first n-type cladding layer closer to the light-emitting layer and a second n-type cladding layer farther from the light-emitting layer than the first n-type cladding layer, and the Si concentration of the first n-type cladding layer is higher than that of the second n-type cladding layer, and the thickness of the first n-type cladding layer is smaller than that of the second n-type cladding layer. Thereby, the emission intensity can be improved compared to the light-emitting device employing a sapphire substrate (other structures and dimensions are the same except for using a single n-type cladding layer).

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

A light-emitting device according to Embodiment 1 has a plurality of Group III nitride semiconductor layers on a GaN substrate having a c-plane main surface.

Figure 1:
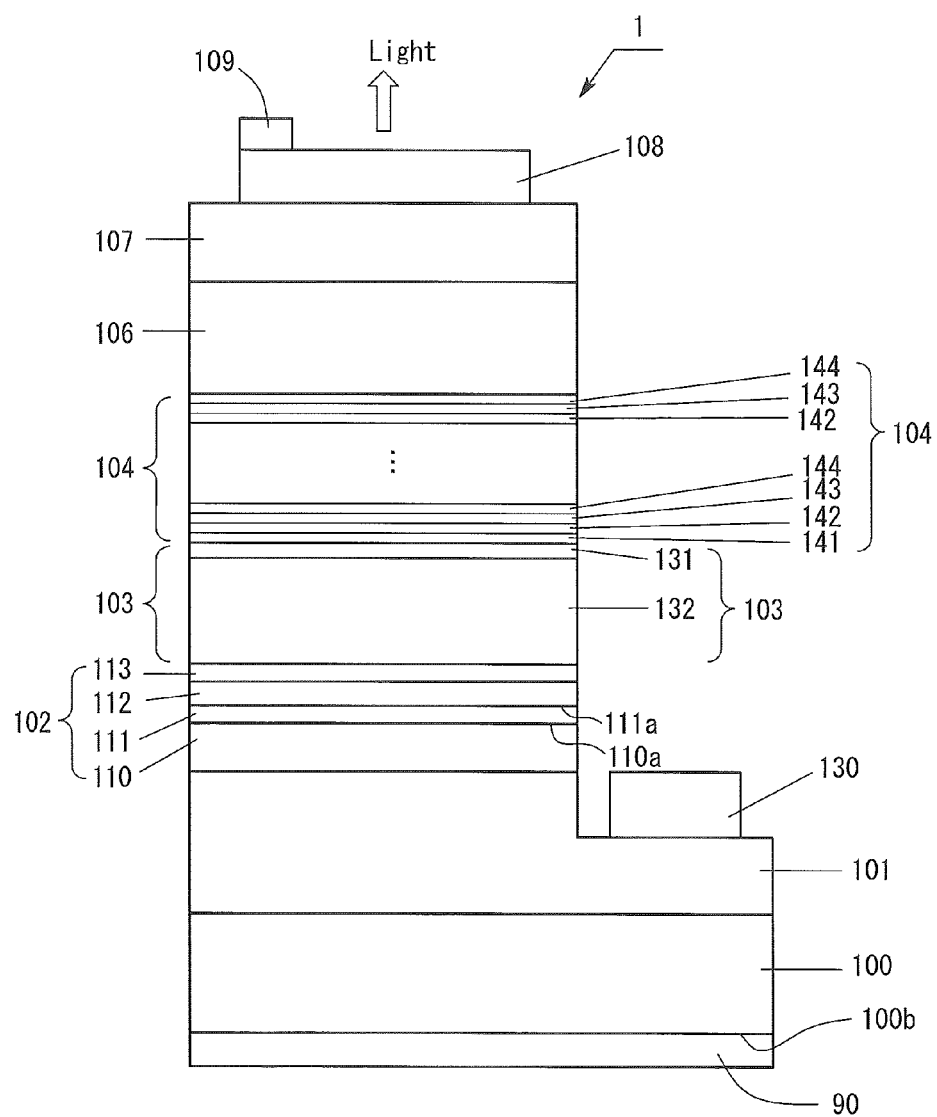
FIG. 1 shows the structure of a light-emitting device according to Embodiment 1.

FIG. 1 shows the structure of the light-emitting device 1 according to Embodiment 1. The light-emitting device 1 includes a GaN substrate 100 with no impurities added; an n-type contact layer 101; an ESD layer (electrostatic discharge layer) 102; an n-type cladding layer 103; a light-emitting layer 104; a p-type cladding layer 106; and a p-type contact layer 107, the layers 101 to 107 being formed of a Group III nitride semiconductor and deposited on the GaN substrate. A p-electrode 108 as a transparent electrode (such as ITO) is formed on the p-type contact layer 107; a pad electrode 109 is formed at a corner of the p-electrode 108; and an n-electrode 130 is formed on a portion of the n-type contact layer 101 exposed through removal of the corresponding portions of the layers 102 to 107 by etching from the p-type contact layer 107. An aluminum reflective film 90 is formed on a back surface 100b of the GaN substrate 100. The light-emitting device according to Embodiment 1 is of a face-up type which emits light from the p-electrode 108 (such as ITO).

The n-type contact layer 101 is formed of n-GaN and has a thickness of 2 µm and a Si centration of $1\times10^{18}/cm^3$ or more. The n-type contact layer 101 has a threading dislocation density of $5.0\times10^6/cm^2$ or less at a thickness of 1 m or more. The n-type contact layer 101 may comprise a plurality of layers having different carrier concentrations to make good contact with the n-electrode 130.

The ESD layer 102 has a four-layer structure including a first ESD layer 110, a second ESD layer 111, a third ESD layer 112, and a fourth ESD layer 113, the layers being sequentially deposited on the n-type contact layer 101. The first ESD layer 110 is formed of n-GaN and has a Si concentration of $1\times10^{16}$ to $5\times10^{17}/cm^3$. The first ESD layer 110 has a thickness of 200 nm to 1,000 nm.

The second ESD layer 111 is formed of Si-doped GaN, and has a characteristic value, as defined by the product of Si concentration (/cm$^3$) and thickness (nm), of $0.9\times10^{20}$ to $3.6\times 10^{20}$ (nm/cm$^3$). When the second ESD layer 111 has a thickness of 30 nm, the Si concentration is $3.0\times10^{18}$ to $1.2\times10^{19}/cm^3$.

The third ESD layer 112 is formed of undoped GaN. The third ESD layer 112 has a thickness of 50 nm to 200 nm. The third ESD layer 112 is undoped, but has a carrier concentration of $1\times10^{16}/cm^3$ to $1\times10^{17}/cm^3$ due to residual carrier. The third ESD layer 112 may be doped with Si in a range that the carrier concentration is $5\times10^{17}/cm^3$ or less.

The fourth ESD layer 113 is formed of Si-doped GaN, and has a characteristic value, as defined by the product of Si concentration (/cm$^3$) and thickness (nm), of $0.9\times10^{20}$ to $3.6\times 10^{20}$ (nm/cm$^3$). For example, the fourth ESD layer 113 has a thickness of 30 nm, the Si concentration is $3.0\times10^{18}/cm^3$ to $1.2\times10^{19}/cm^3$.

The n-type cladding layer 103 has a two-layer structure including a second n-type cladding layer 132 and a first n-type cladding layer 131 formed thereon. The second n-type cladding layer 132 is formed of Si-doped $Al_{0.2}Ga_{0.8}N$ and has a thickness of 140 nm and a Si concentration of $1.0\times10^{18}/cm^3$. The first n-type cladding layer 131 is formed of a Si-doped $Al_{0.2}Ga_{0.8}N$ and has a thickness of 10 nm and a Si concentration of $2.0\times10^{19}/cm^3$. The overall thickness of the n-type cladding layer 103 is 150 nm. The overall thickness of the n-type cladding layer 103 is preferably 105 nm to 550 nm.

The thickness of the second n-type cladding layer 132 may be 100 nm to 500 nm. When the thickness is smaller than 100 nm, the blocking function of the holes is deteriorated, to thereby reduce the effect of confining holes and light in the light-emitting layer 104. When the thickness is larger than 500 nm, the layer is excessively thick as a cladding layer, the resistance of the cladding layer increases, and the production time is longer, which is not desirable. The second n-type cladding layer 132 preferably has a Si concentration of $1.0\times 10^{18}/cm^3$ to $5.0\times10^{18}/cm^3$. When the Si concentration is lower than $1.0\times10^{18}/cm^3$, the conductivity is reduced, and the driving voltage is increased, which is not desirable. When the Si concentration is higher than $5.0\times10^{18}/cm^3$, crystallinity of the light-emitting layer 104 is deteriorated, which is not desirable.

The thickness of the first n-type cladding layer 131 may be 5 nm to 50 nm. When the thickness of the first n-type cladding layer 131 is smaller than 5 nm, the effect of improving the electron density by increasing the Si concentration of this layer is reduced, and even potential is difficult on an interface between the first n-type cladding layer 131 and the light-emitting layer 104. As a result, improvement of emission output is not achieved.

When the thickness of the first n-type cladding layer 131 is larger than 50 nm, the crystallinity of the light-emitting layer 104 is deteriorated due to high Si concentration, or Si diffusion to the light-emitting layer 104 increases, which is not desirable. The first n-type cladding layer 131 preferably has a Si concentration of $1.0\times10^{19}/cm^3$ to $2.5\times10^{19}/cm^3$. When the Si concentration is lower than $1.0\times10^{19}/cm^3$, potential cannot be evenly applied to the interface between the first n-type cladding layer 131 and the light-emitting layer 104, which is not desirable. When the Si concentration is higher than $2.5\times 10^{19}/cm^3$, Si diffusion to the light-emitting layer 104 increases, or the crystallinity of the light-emitting layer 104 is deteriorated, which is not desirable.

The light-emitting layer 104 (also referred to as active layer) has a MQW structure in which eight layer units are repeatedly deposited, each layer unit including four layers of an $Al_{0.05}Ga_{0.95}N$ layer 141 (thickness: 2.4 nm), an $In_{0.2}Ga_{0.8}N$ layer 142 (thickness: 3.2 nm), a GaN layer 143 (thickness: 0.6 nm), an $Al_{0.2}Ga_{0.8}N$ layer 144 (thickness: 0.6 nm), which are sequentially deposited. However, the initial layer of the light-emitting layer 104, which is in contact with the first n-type cladding layer 131 is the $Al_{0.05}Ga_{0.95}N$ layer 141, and the final layer of the light-emitting layer 104, which is in contact with the p-type cladding layer 106 is the $Al_{0.2}Ga_{0.8}N$ layer 144. The overall thickness of the light-emitting layer 104 is 54.4 nm. All layers of the light-emitting layer 104 are undoped.

The p-type cladding layer 106 is formed of $Al_{0.3}Ga_{0.7}N$ and has a thickness of 33 nm, and doped with Mg as a p-type impurity at a concentration of $1 \times 10^{20}/cm^3$. The p-type contact layer 107 is Mg-doped p-GaN. To make good contact with the p-electrode, the p-type contact layer 107 may comprise a plurality of layers having different carrier concentrations. The n-type cladding layer 103 and the p-type cladding layer 106 have a function of confining holes and electrons, and light in the light-emitting layer 104.

The p-type cladding layer 106 may have a superlattice structure. For example, a plurality of (e.g. 5 to 12) layer units may be repeatedly deposited, each layer unit including a $p-In_{0.05}Ga_{0.95}N$ layer (thickness: 1.7 nm) and a $p-Al_{0.3}Ga_{0.7}N$ layer (thickness: 3.0 nm) which are sequentially deposited. However, the first layer of the p-type cladding layer 106, which is in contact with the light-emitting layer 104 is preferably the $p-In_{0.05}Ga_{0.95}N$ layer, and the final layer of the p-type cladding layer 106, which is in contact with p-type contact layer 107 is preferably the $p-Al_{0.3}Ga_{0.7}N$ layer.

Figure 2A:
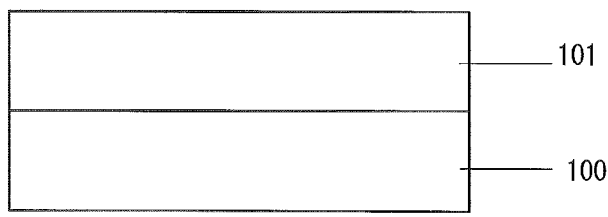
FIGS. 2A, 2B, and 2C are the cross-sections of a device showing processes for producing a light-emitting device.
Figure 2B:
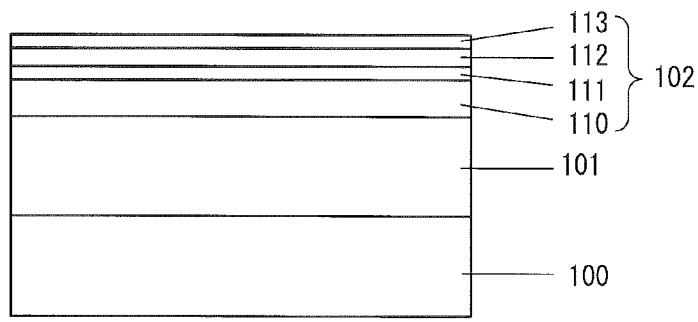
Figure 2C:
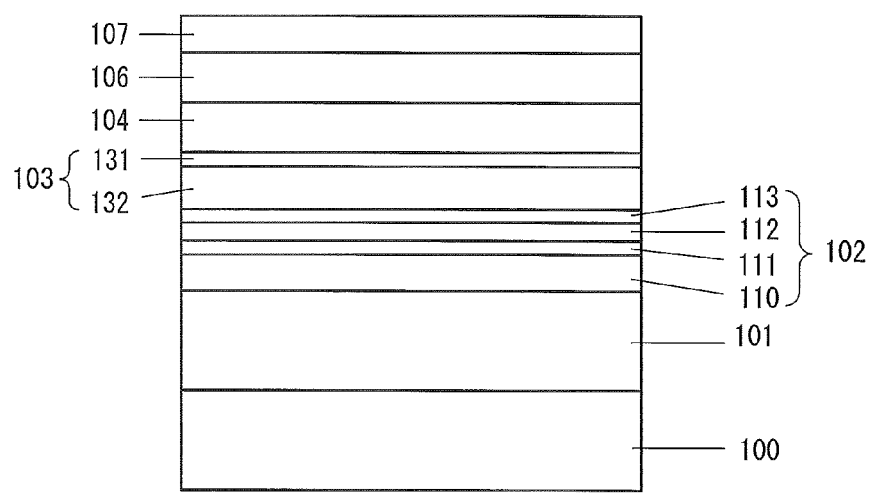

Next will be described with reference to FIGS. 2A to 2C, a method for producing the light-emitting device 1. However, in FIGS. 2A to 2C, the periodic structure of the superlattice shown in FIG. 1 is omitted. Crystal growth is carried out through metal-organic chemical vapor deposition (MOCVD). The gases employed are as follows: hydrogen or nitrogen ($H_2$ or $N_2$) as a carrier gas; ammonia gas ($NH_3$) as a nitrogen source; trimethylgallium ($Ga(CH_3)_3$, hereinafter referred to as "TMG") as a Ga source; trimethylindium ($In(CH_3)_3$, hereinafter referred to as "TMI") as an In source; trimethylaluminum ($Al(CH_3)_3$, hereinafter referred to as "TMA") as an Al source; silane ($SiH_4$) as an n-type dopant gas; and cyclopentadienylmagnesium ($Mg(C_5H_5)_2$, hereinafter referred to as "$Cp_2Mg$") as a p-type dopant gas.

Firstly, the GaN substrate 100 was heated at 1,080° C., in a hydrogen atmosphere for cleaning, to thereby remove deposits from the surface of the GaN substrate 100. Thereafter the substrate temperature was lowered to 1,020° C., through MOCVD, TMG, ammonia gas as raw material gases, silane gas as an impurity gas, and hydrogen gas as a carrier gas were supplied, to thereby form the n-type contact layer 101 made of GaN having a Si concentration of $4.5 \times 10^{18}/cm^3$ so as to have a thickness of 2 m (FIG. 2A). The threading dislocation density of the n-type contact layer 101 was $5 \times 10^6/cm^2$ or less at a thickness of 1 μm.

Subsequently, the ESD layer 102 was formed as follows. Firstly, on the n-type contact layer 101, through MOCVD, the first ESD layer 110 was formed of n-GaN having a thickness of 200 nm to 1,000 nm, and a Si concentration of $1 \times 10^{16}/cm^3$ to $5 \times 10^{17}/cm^3$. The growth temperature was 900° C. or higher to obtain a low pit density and good quality crystal. When the growth temperature is adjusted to 1,000° C. or higher, a crystal of higher quality is grown, which is preferred.

Next, on the first ESD layer 110, through MOCVD, the second ESD layer 111 was formed of n-GaN having a characteristic value, as defined by the product of Si concentration (/$cm^3$) and thickness (nm), of $0.9 \times 10^{20}$ to $3.6 \times 10^{20}$ (nm/$cm^3$). The growth temperature was adjusted to 800° C. to 950° C. On the second ESD layer 111, through MOCVD, the third ESD layer 112 was formed of undoped GaN having a thickness of 50 nm to 200 nm. The growth temperature was adjusted to 800° C. to 950° C., so as to obtain a crystal having a carrier concentration of $5 \times 10^{17}/cm^3$ or less.

Subsequently, on the third ESD layer 112, through MOCVD, the fourth ESD layer 113 was formed of n-GaN having a characteristic value, as defined by the product of Si concentration (/$cm^3$) and thickness (nm), of $0.9 \times 10^{20}$ to $3.6 \times 10^{20}$ (nm/$cm^3$). The growth temperature was adjusted to 800° C. to 950° C. In the above procedure, the ESD layer 102 was formed on the n-type contact layer 101 (FIG. 2B).

After the substrate temperature was adjusted to 950° C., the second n-type cladding layer 132 was formed of $Al_{0.2}Ga_{0.8}N$ doped with Si at a concentration of $1.0 \times 10^{18}/cm^3$ so as to have a thickness of 140 nm on the ESD layer 102. While the substrate temperature was maintained at 950° C., the first n-type cladding layer 131 was formed of $Al_{0.2}Ga_{0.8}N$ doped with Si at a concentration of $2.0 \times 10^{19}/cm^3$ so as to have a thickness of 10 nm on the second n-type cladding layer 132.

Next, the light-emitting layer 104 was formed on the first n-type cladding layer 131. The light-emitting layer 104 was formed by repeatedly depositing eight layer units, each including sequentially deposited four layers: the $Al_{0.05}Ga_{0.95}N$ layer 141, the $In_{0.2}Ga_{0.8}N$ layer 142, the GaN layer 143, and the $Al_{0.2}Ga_{0.8}N$ layer 144. The growth temperature of the $Al_{0.05}Ga_{0.95}N$ layer 141 was within a range of 800° C. to 950° C., and the growth temperatures of the $In_{0.2}Ga_{0.8}N$ layer 142, the GaN layer 143, and the $Al_{0.2}Ga_{0.8}N$ layer 144 were 770° C. Needless to say, in the growth of each layer, the substrate temperature may be constantly maintained at 770° C. The light-emitting layer 104 was formed under supply of the corresponding raw material gases.

Subsequently, the p-type cladding layer 106 was formed on the light-emitting layer 104. The p-type cladding layer 106 was formed of $p-Al_{0.3}Ga_{0.7}N$ so as to have a thickness of 33 nm under supply of $CP_2Mg$, TMA, TMG, and ammonia while the substrate temperature was maintained at 855° C.

Then, while the substrate temperature was maintained at 1,000° C., under supply of TMG, ammonia, and $CP_2Mg$, the p-type contact layer 107 was formed of p-type GaN doped with Mg at a concentration of $1 \times 10^{20}$ $cm^{-3}$ so as to have a thickness of 50 nm. Thus, the device structure as shown in FIG. 2C was formed. The p-type contact layer 107 may have an Mg concentration of $1 \times 10^{19}$ to $1 \times 10^{21}$ $cm^{-3}$. The p-type contact layer 107 may have a thickness of 10 nm to 100 nm.

Subsequently, Mg was activated through thermal treatment, and then dry etching was performed from the top surface of the p-type contact layer 107, to thereby form a groove reaching the n-type contact layer 101. The ITO p-electrode 108 was formed on the p-type contact layer 107, and the n-electrode 130 was formed from V/Al/Ti/Ni/Ti/Au (which were deposited in this order on the n-type contact layer 101) on the surface of the n-type contact layer 101 exposed at the bottom of the groove through dry etching. On the back surface 100b of the GaN substrate 100, the Al reflective film 90 was formed, and the pad electrode 109 was formed from Ni/Au/Al (which were deposited in this order on the p-electrode 108) at the corner of the p-electrode 108. Thus, the light-emitting device 1 shown in FIG. 1 was produced.

Through the above method, light-emitting devices were produced varying the Si concentration of the first n-type cladding layer 131: 0/$cm^3$ (with no supply of silane), $2 \times 10^{18}/cm^3$, $4 \times 10^{18}/cm^3$, $8 \times 10^{18}/cm^3$, $1.2 \times 10^{19}/cm^3$, $1.4 \times 10^{19}/cm^3$, $1.6 \times 10^{19}/cm^3$, $1.8 \times 10^{19}/cm^3$, $2.0 \times 10^{19}/cm^3$, $2.2 \times 10^{19}/cm^3$, and $2.4 \times 10^{19}/cm^3$. The emission intensity was measured at these Si concentrations.

Figure 3:
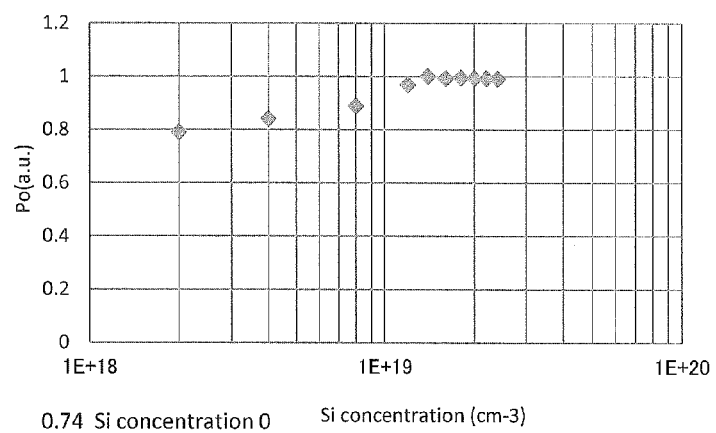
FIG. 3 is a characteristics chart showing the relationship between the Si concentration of the first n-type cladding layer and the emission output in the light-emitting device according to Embodiment 1.

FIG. 3 shows the measurement result of emission output. Since the horizontal axis of FIG. 3 represents a logarithm, the zero value cannot be plotted when Si is not added (when the Si concentration is 0). At this time, the emission output is 0.74 (a.u.). As is clear from FIG. 3, when the Si concentration is $1.2\times10^{19}/cm^3$ to $2.4\times10^{19}/cm^3$, the emission output is 0.97 (a.u.) or more, which is higher by 15% or more compared to the emission output of 0.84 (a.u.) when the Si concentration is $4.0\times10^{18}/cm^3$ or less. When the Si concentration is $1.4\times10^{19}/cm^3$, the emission output is 1 (a.u.), which is the maximum. When the Si concentration is $1.4\times10^{19}/cm^3$ or more, the emission output is almost 1 (0.99 (a.u.)) and constant. Therefore, it is understood from the characteristics of FIG. 3 that the emission output begins to be saturated when the Si concentration is $1.0\times10^{19}/cm^3$ at which measurement was not made. When the Si concentration is $1.0\times10^{19}/cm^3$, it also has an effect on the increase of the emission output. Regarding the upper limit value, even if the Si concentration is increased to $2.0\times10^{19}/cm^3$, $2.2\times10^{19}/cm^3$, and $2.4\times10^{19}/cm^3$, the emission output is not decreased. When the Si concentration is $2.5\times10^{19}/cm^3$, the emission output is 1 (0.99 (a.u.), and it is effective to improve the emission output. Therefore, it is understood from the characteristics of FIG. 3 that when the Si concentration of the first n-type cladding layer 131 falls within a range of $1.0\times10^{19}/cm^3$ to $2.5\times10^{19}/cm^3$, the emission output is improved.

When the Si concentration exceeds $2.0\times10^{19}/cm^3$, the reverse current blocking characteristic was slightly deteriorated. Therefore, the Si concentration of the first n-type contact layer 131 is preferably $1.2\times10^{19}/cm^3$ to $2.0\times10^{19}/cm^3$ at which measurement was made, considering the deterioration of reverse current blocking characteristic. When considering the characteristics obtained from FIG. 3 and a slight deterioration of reverse current blocking characteristic, the Si concentration is preferably $1.0\times10^{19}/cm^3$ to $2.0\times10^{19}/cm^3$.

Figure 4:
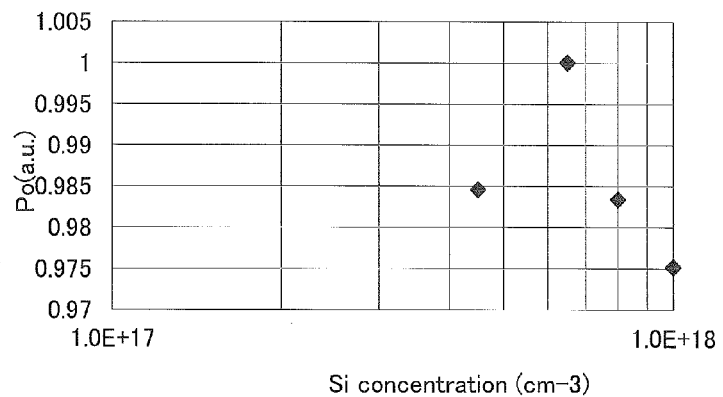
FIG. 4 is a characteristics chart showing the relationship between the Si concentration of the n-type cladding layer and the emission output in a light-emitting device employing a sapphire substrate according to the conventional example.

For comparison, the light-emitting device was produced by growing the n-type contact layer 101 to the p-type contact layer 107 after a buffer layer was formed on a sapphire substrate. However, in this case, the n-type cladding layer 103 does not have a two-layer structure but is a single layer having a thickness of 150 nm. That is, the n-type cladding layer 103 as a single layer (thickness: 150 nm) was formed instead of the first n-type cladding layer 131 (thickness: 10 nm) and the second n-type cladding layer 132 (thickness: 140 nm). The output characteristics were measured for the light-emitting devices produced varying the Si concentration of the n-type cladding layer as a single layer: $4.5\times10^{17}/cm^3$, $6.5\times10^{17}/cm^3$, $8.0\times10^{17}/cm^3$, and $1.0\times10^{18}/cm^3$. FIG. 4 shows the measurement result. When the Si concentration of the n-type cladding layer is $6.5\times10^{17}/cm^3$, the emission output is the maximum, and even if the Si concentration is lower or higher than the maximum value, the emission output is decreased.

From this, it is revealed that the n-type cladding layer of the present invention having a two-layer structure wherein the first n-type cladding layer has a Si concentration higher than that of the second n-type cladding layer and the first n-type cladding layer has a thickness smaller than that of the second n-type cladding layer, has a superior effect on the emission output.

Embodiment 2

Figure 5:
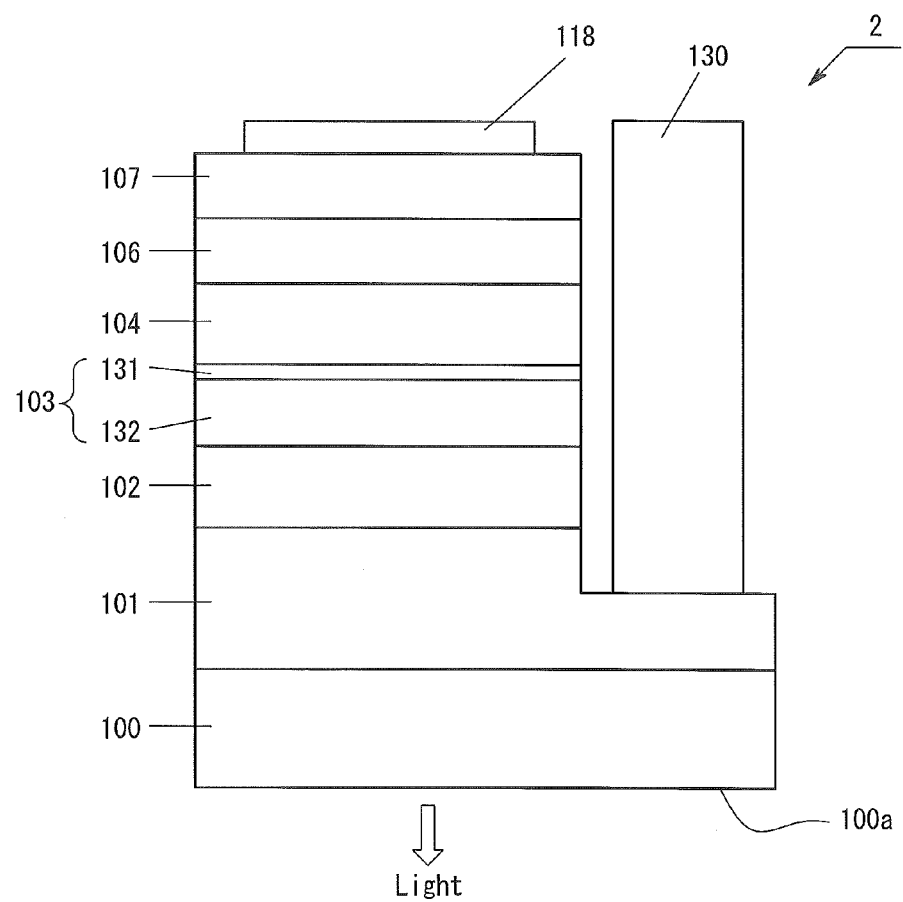
FIG. 5 shows the structure of a light-emitting device according to Embodiment 2.

The light-emitting device 1 according to Embodiment 1 is of a face-up type, and the light-emitting device 2 according to Embodiment 2 is of a face-down type. The elements serving the same function as in Embodiment 1 are assigned with the same reference numerals as those of FIG. 1. In FIG. 5, a plurality of layers constituting the ESD layer 102 and the light-emitting layer 104 shown in FIG. 1 are omitted. A p-electrode 118 to be formed on the entire surface of the p-type contact layer 107 is a reflective film formed of Ni/Al/Ag/Al deposited on the p-type contact layer 107. The p-electrode 118 also serves as a land pad to bond the light-emitting device 2 to the frame. The n-electrode 130 is the same metal laminate as that in Embodiment 1, and the top surface of the p-electrode 118 and the top surface of the n-electrode 130 are on the same surface, i.e., the same level. The surface 100a of the GaN substrate 100 on which a device layer is not formed is a light output surface. The structure (Si concentration and thickness) of the first n-type cladding layer 131 and the second n-type cladding layer 132 according to Embodiment 2 is the same as that in Embodiment 1. Thus, the present invention may be a face-down type (flip-chip type) light-emitting device.

Embodiment 3

Figure 6:
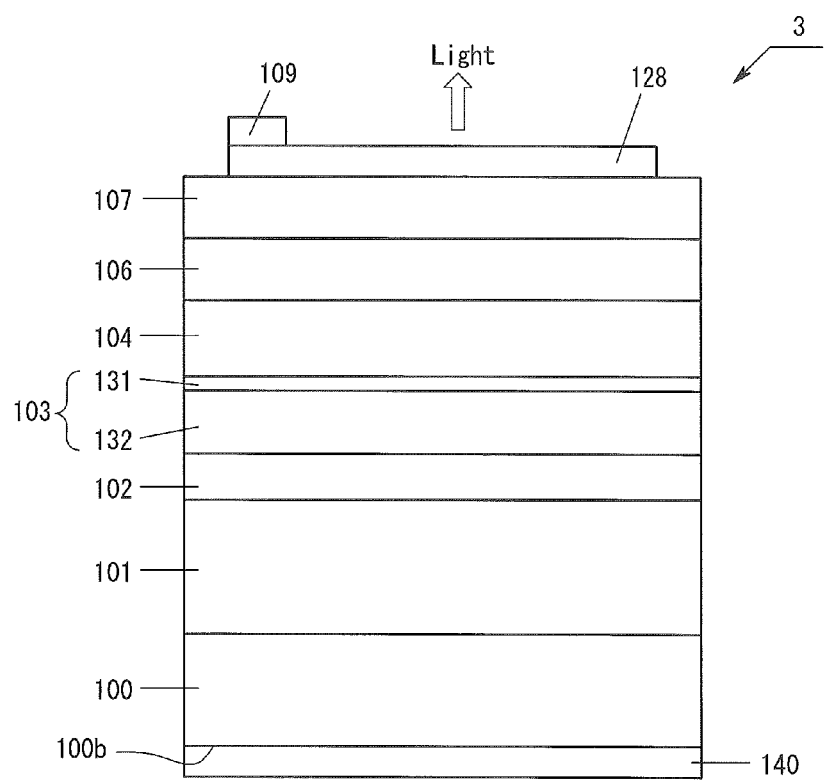
FIG. 6 shows the structure of a light-emitting device according to Embodiment 3.
Figure 7:
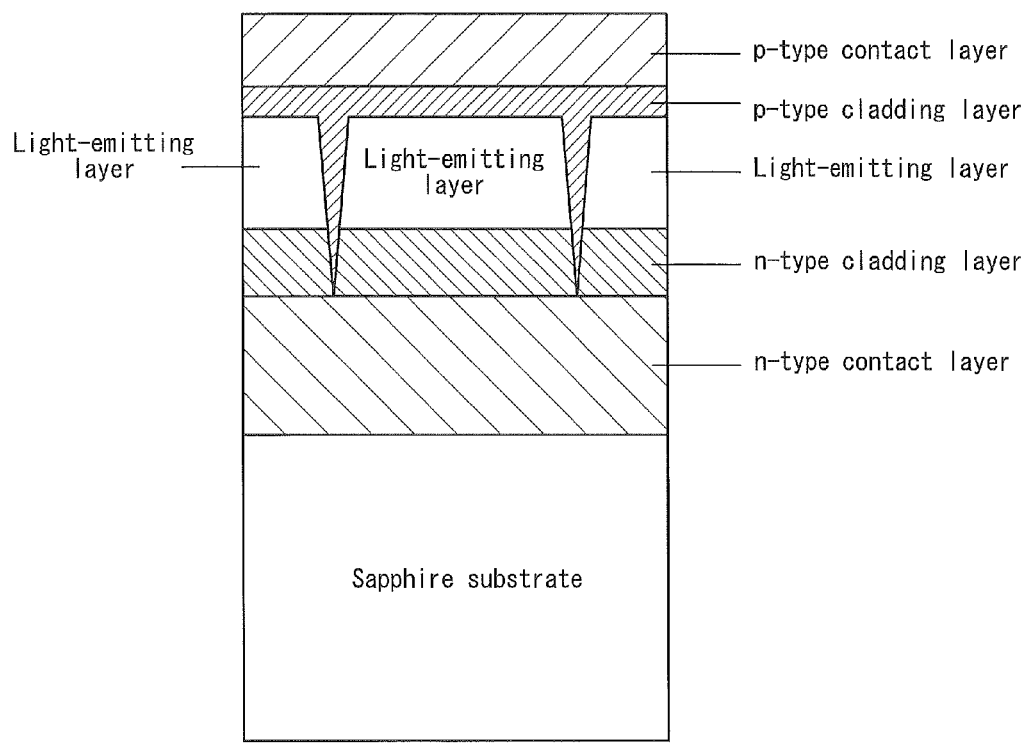
FIG. 7 shows the structure of pits occurred in the light-emitting device employing a sapphire substrate according to the conventional example.

The light-emitting device 3 according to Embodiment 3 shown in FIG. 6 is a counter electrode type light-emitting device. The elements serving the same function as in Embodiment 1 are assigned with the same reference numerals as those of FIG. 1. A GaN substrate 100 is formed of n-type GaN doped with Si at a concentration of $4\times10^{18}/cm^3$. An n-electrode 140 is formed on the entire surface of a back surface 100b of the GaN substrate 100. The n-electrode 140 is a metal film of Al/Ag/Al sequentially deposited on the back surface 100b of the GaN substrate 100. The n-electrode 140 serves as a light reflective film. An ITO p-electrode 128 is formed on the entire top surface of a p-type contact layer 107, and a pad electrode 109 is formed at the corner of the p-electrode 128. In the light-emitting device 3, a light is output from the p-type contact layer 107.

A light reflective film may be formed on the p-type contact layer 107, and a transparent n-electrode may be formed on the surface 100b of the GaN substrate 100 on which a device layer is not formed, to thereby output a light form the GaN substrate 100.

Variation

In the above embodiments, the first n-type cladding layer 131 is directly bonded to the light-emitting layer 104. However, a guide layer may be provided between the first n-type cladding layer 131 and the light-emitting layer 104. Moreover, in all embodiments, the first n-type cladding layer 131 and the second n-type cladding layer 132 are formed of $Al_{0.2}Ga_{0.8}N$. However, the first n-type cladding layer 131 and the second n-type cladding layer 132 may be formed of AlGaN having other composition ratio, or GaN or InGaN having a bandgap larger than that of the well layer of the light-emitting layer 104. The first n-type cladding layer 131 and the second n-type cladding layer 132 are semiconductor made of the same material. However, the first n-type cladding layer 131 and the second n-type cladding layer 132 may be semiconductor having different composition or having the same composition with different composition ratios. For example, the second n-type cladding layer 132 may be formed of AlGaN or GaN, and the first n-type cladding layer 131 may be formed of InGaN to easily obtain a high electron density. In all embodiments, the ESD layer 102 may be omitted. The p-type cladding layer 106 may have a periodic structure including a plurality of layers. For example, the p-type cladding layer 106 may have a superlattice structure including AlGaN with any composition ratio and InGaN with any composition ratio, a superlattice structure of AlGaN and GaN, or a superlattice structure of GaN and InGaN. The p-type cladding layer 106 may have a Mg concentration of $5×10^{19}/cm^3$ to $5×10^{20}/cm^3$.

The light-emitting device 1 according to Embodiment 1 shown in FIG. 1 and the light-emitting device 2 shown in FIG. 5 may be applied to the case where when a sapphire substrate is employed instead of the GaN substrate 100, the pit density is $5.0×10^6/cm^2$ or less and the pit diameter is 100 nm or less on the top surface opposite to the n-type cladding layer of the light-emitting layer 104 (the interface between the light-emitting layer 104 and the p-type cladding layer 106). When the pit density and the pit diameter are below the above values on the top surface of the light-emitting layer, the emission output is estimated to be reduced. Therefore, the characteristic structure of the present application in which the n-type cladding layer has at least two layers, the first n-type cladding layer has a Si concentration higher than that of the second n-type cladding layer, and the first n-type cladding layer has a thickness smaller than that of the second n-type cladding layer, can increase the emission output.

The present invention can be employed in a high output Group III nitride semiconductor light-emitting device.

What is claimed is:

1. A Group III nitride semiconductor light-emitting device having a plurality of Group III nitride semiconductor layers on a surface of Group III nitride semiconductor substrate, the light-emitting device comprising:
    an n-type contact layer on which an n-electrode is formed, a light-emitting layer, an n-type cladding layer formed between the light-emitting layer and the n-type contact layer;
    wherein the n-type cladding layer has a structure of at least two layers including a first n-type cladding layer closer to the light-emitting layer and a second n-type cladding layer farther from the light-emitting layer than the first n-type cladding layer; and
    the first n-type cladding layer has a Si concentration higher than that of the second n-type cladding layer, and the first n-type cladding layer has a thickness smaller than that of the second n-type cladding layer.

2. The Group III nitride semiconductor light-emitting device according to claim 1, wherein the pit density is $5.0×10^6/cm^2$ or less on a top surface opposite to the n-type cladding layer of the light-emitting layer.

3. The Group III nitride semiconductor light-emitting device according to claim 1, wherein the pit diameter is 100 nm or less on a top surface opposite to the n-type cladding layer of the light-emitting layer.

4. The Group III nitride semiconductor light-emitting device according to claim 1, wherein the second n-type cladding layer has a Si concentration of $1.0×10^{18}/cm^3$ to $5.0×10^{18}/cm^3$.

5. The Group III nitride semiconductor light-emitting device according to claim 1, wherein the second n-type cladding layer has a thickness of 100 nm to 500 nm.

6. The Group III nitride semiconductor light-emitting device according to claim 1, wherein the first n-type cladding layer has a thickness of 5 nm to 50 nm.

7. The Group III nitride semiconductor light-emitting device according to claim 6, wherein the pit density is $5.0×10^6/cm^2$ or less on a top surface opposite to the n-type cladding layer of the light-emitting layer.

8. The Group III nitride semiconductor light-emitting device according to claim 6, wherein the pit diameter is 100 nm or less on a top surface opposite to the n-type cladding layer of the light-emitting layer.

9. The Group III nitride semiconductor light-emitting device according to claim 1, wherein the first n-type cladding layer has a Si concentration of $1.0×10^{19}/cm^3$ to $2.5×10^{19}/cm^3$.

10. The Group III nitride semiconductor light-emitting device according to claim 9, wherein the pit density is $5.0×10^6/cm^2$ or less on a top surface opposite to the n-type cladding layer of the light-emitting layer.

11. The Group III nitride semiconductor light-emitting device according to claim 9, wherein the pit diameter is 100 nm or less on a top surface opposite to the n-type cladding layer of the light-emitting layer.

12. The Group III nitride semiconductor light-emitting device according to claim 9, wherein the first n-type cladding layer has a thickness of 5 nm to 50 nm.

13. The Group III nitride semiconductor light-emitting device according to claim 12, wherein the second n-type cladding layer has a Si concentration of $1.0×10^{18}/cm^3$ to $5.0×10^{18}/cm^3$.

14. The Group III nitride semiconductor light-emitting device according to claim 12, wherein the second n-type cladding layer has a thickness of 100 nm to 500 nm.

15. A Group III nitride semiconductor light-emitting device having a plurality of Group III nitride semiconductor layers on a surface of a substrate of a material different from Group III nitride semiconductor, the light-emitting device comprising:
    an n-type contact layer on which an n-electrode is formed, a light-emitting layer, an n-type cladding layer formed between the light-emitting layer and the n-type contact layer;
    wherein the pit density is $5.0×10^6/cm^2$ or less, and the pit diameter is 100 nm or less on a top surface opposite to the n-type cladding layer of the light-emitting layer;
    the n-type cladding layer has a structure of at least two layers including a first n-type cladding layer closer to the light-emitting layer and a second n-type cladding layer farther from the light-emitting layer than the first n-type cladding layer; and
    the first n-type cladding layer has a Si concentration higher than that of the second n-type cladding layer, and the first n-type cladding layer has a thickness smaller than that of the second n-type cladding layer.

16. The Group III nitride semiconductor light-emitting device according to claim 15, wherein the first n-type cladding layer has a Si concentration of $1.0×10^{19}/cm^3$ to $2.5×10^{19}/cm^3$.

17. The Group III nitride semiconductor light-emitting device according to claim 15, wherein the first n-type cladding layer has a thickness of 5 nm to 50 nm.

18. The Group III nitride semiconductor light-emitting device according to claim 15, wherein the second n-type cladding layer has a Si concentration $1.0×10^{18}/cm^3$ to $5.0×10^{18}/cm^3$.

19. The Group III nitride semiconductor light-emitting device according to claim 15, wherein the second n-type cladding layer has a thickness of 100 nm to 500 nm.

* * * * *